United States Patent
Kobolla et al.

(10) Patent No.: US 10,269,755 B2
(45) Date of Patent: Apr. 23, 2019

(54) POWER ELECTRONIC SWITCHING DEVICE, ARRANGEMENT HEREWITH AND METHODS FOR PRODUCING THE SWITCHING DEVICE

(71) Applicant: SEMIKRON ELEKTRONIK GMBH & CO. KG, Nuremberg (DE)

(72) Inventors: Harald Kobolla, Seukendorf (DE); Jörg Ammon, Erlangen (DE)

(73) Assignee: SEMIKRON ELEKTRONIK GmbH & CO. KG, Nuremberg (DE)

( * ) Notice: Subject to any disclaimer, the term of this patent is extended or adjusted under 35 U.S.C. 154(b) by 107 days.

(21) Appl. No.: 15/657,277

(22) Filed: Jul. 24, 2017

(65) Prior Publication Data

US 2018/0026005 A1   Jan. 25, 2018

(30) Foreign Application Priority Data

Jul. 22, 2016   (DE) .................. 10 2016 113 538

(51) Int. Cl.
*H01L 23/00*   (2006.01)
*H01L 23/36*   (2006.01)
(Continued)

(52) U.S. Cl.
CPC .............. *H01L 24/72* (2013.01); *H01L 23/36* (2013.01); *H01L 23/4093* (2013.01); *H01L 23/4985* (2013.01); *H01L 23/49811* (2013.01); *H01L 24/90* (2013.01); *H01L 25/072* (2013.01); *H01L 23/42* (2013.01)

(58) Field of Classification Search
None
See application file for complete search history.

(56) References Cited

U.S. PATENT DOCUMENTS

2015/0325494 A1* 11/2015 Kroneder ............ H01L 23/4006
361/715

FOREIGN PATENT DOCUMENTS

DE   41 32 947    4/1993
DE   101 21 970   11/2002
(Continued)

OTHER PUBLICATIONS

EP 17179924.0, European Search Report dated Dec. 6, 4 pages—German, 4 pages—1 pg.—English.
(Continued)

*Primary Examiner* — Cory W Eskridge
(74) *Attorney, Agent, or Firm* — Lackenbach Siegel, LLP; Andrew F. Young (57) ABSTRACT

A switching device has a substrate, a power semiconductor component arranged thereon, a connection device and a pressure device. The substrate has conductor tracks electrically insulated from each another. A power semiconductor component is arranged on one of the conductor tracks. The connection device is embodied as a film composite having an electrically conductive film and an electrically insulating film and forming a first and a second main surface. The switching device is connected in a circuit-conforming manner by the connection device, and a contact area of the first main surface of the power semiconductor component is connected to a first contact area of an assigned conductor track of the substrate in a force-locking and electrically conductive manner.

16 Claims, 4 Drawing Sheets

(51) Int. Cl.
*H01L 23/40* (2006.01)
*H01L 23/498* (2006.01)
*H01L 25/07* (2006.01)
*H01L 23/42* (2006.01)

(56) References Cited

FOREIGN PATENT DOCUMENTS

| | | |
|---|---|---|
| DE | 103 55 925 | 6/2005 |
| DE | 10 2006 025 531 | 4/2008 |
| DE | 10 2013 104 949 | 4/2014 |
| DE | 10 2013 104 950 | 4/2014 |
| DE | 10 2013 108185 | 2/2015 |
| DE | 10 2014 016570 | 11/2015 |
| DE | 10 2016 113 538.0 | 7/2016 |

OTHER PUBLICATIONS

DE 10 2016 113 538.0, Search Report dated Mar. 15, 2017, 8 pages—German, 4 pages—English.

\* cited by examiner

POWER ELECTRONIC SWITCHING DEVICE, ARRANGEMENT HEREWITH AND METHODS FOR PRODUCING THE SWITCHING DEVICE

CROSS REFERENCE TO RELATED APPLICATIONS

This application relates to, and claims priority from, DE Ser. No. 10 2016 113 538.0 filed Jul. 22, 2016, the entire contents of which are incorporated herein by reference.

FIGURE SELECTED FOR PUBLICATION

FIG. 3

BACKGROUND OF THE INVENTION

Field of the Invention

The invention describes a power electronic switching device which can form a basic cell of a power semiconductor module or of a power electronic system by virtue of the fact that by itself or in combination with farther, preferably identical, basic cells it forms the power electronic basic building block of the power semiconductor module or of the power electronic system. Furthermore, the invention describes an arrangement comprising such a power electronic switching device, and methods for producing particularly preferred embodiments of such a power electronic switching device.

Description of the Related Art

The prior art, for example disclosed in DE 10 2013 104 949 B3 discloses a switching device comprising a substrate, a power semiconductor component, a connection device, load terminal devices and a pressure device. In this case, the substrate has electrically insulated conductor tracks, wherein a power semiconductor component is arranged on a conductor track. The connection device is embodied as a film composite comprising an electrically conductive film and an electrically insulating film and has a first and a second main surface. The switching device is thereby connected in a circuit-conforming manner internally. The pressure device has a pressure body having a first cutout, projecting from which a pressure element is arranged, wherein the pressure element presses onto a section of the second main surface of the film composite and in this case said section is arranged within the area of the power semiconductor component in projection along the direction of the normal to the power semiconductor component.

ASPECTS AND SUMMARY OF THE INVENTION

With knowledge of the conditions mentioned, the invention is based on the object of presenting a power electronic switching device and an arrangement therewith and methods for producing the switching device, wherein the switching device is optimized with regard to its complexity and its production outlay.

This object is achieved according to the invention by means of a power electronic switching device by means of an arrangement comprising a power electronic switching device having the features discussed herein and by means of two specific production methods having the features noted herein. Preferred embodiments are described in dependent claims but the invention is not limited thereto.

The switching device according to the invention is embodied comprising a substrate, a power semiconductor component arranged thereon, comprising a connection device and comprising a pressure device, wherein the substrate has conductor tracks electrically insulated from one another, and a power semiconductor component is arranged on one of the conductor tracks, wherein the connection device is embodied as a film composite comprising an electrically conductive film and an electrically insulating film and thus forms a first and a second main surface, wherein the switching device is connected in a circuit-conforming manner internally by means of the connection device, and wherein a contact area of the first main surface of the power semiconductor component is connected to a first contact area of an assigned conductor track of the substrate in a force-locking and electrically conductive manner, for this purpose the pressure device has a pressure body and a pressure element projecting therefrom in the direction of the power semiconductor component, wherein the pressure element presses on a first section of the second main surface of the film composite and in this case said first section is arranged within the area of the power semiconductor component in projection along the direction of the normal to the power semiconductor component.

In the case of this switching device, therefore, a materially bonded connection of the contact area of the first main surface of the power semiconductor component to the assigned contact area of the substrate is explicitly dispensed with. As a result, in comparison with the prior art, a materially bonded connection, preferably embodied as a pressure sintering connection, is replaced by a force-locking connection.

It is preferred if a second contact area of the connection device is connected to a contact area of the conductor tracks of the substrate that are assigned thereto in a force-locking or materially bonded and electrically conductive manner.

Likewise, the power semiconductor component can be electrically conductively connected by its second main surface to the assigned contact area of the first main surface of the connection device in a force-locking or positively locking manner.

It is preferred in this case if the respective materially bonded connection is embodied as a soldering, adhesive or, in particular, pressure sintering connection that is routine in the art.

It is particularly preferred if the pressure body has a first cutout, from which the pressure element projects. In this case, it is furthermore advantageous if said first cutout of the pressure body is embodied as a depression proceeding from a first main surface, in this case the pressure element completely or approximately completely fills said cutout of the pressure body, and the pressure element projects from the cutout of the pressure body at the first main surface thereof in the direction of the connection device, more precisely the second main surface thereof. In this case, the ratio of lateral extent to vertical extent of the pressure body should have a ratio of more than 2 to 1, in particular of more than 4 to 1.

Preferably, the surface area of the first section of the second main surface of the film composite has at least 20%, in particular at least 50%, of the area of the assigned power semiconductor component. In this case, area of the power semiconductor component is understood to mean the entire areal extent thereof, that is to say not just that of the terminal or contact areas.

The arrangement is embodied according to the invention comprising an above-described electronic switching device, comprising a cooling device and comprising a pressure introducing device, wherein this pressure introducing device is supported indirectly or directly against the cooling device and introduces pressure preferably centrally on the pressure device, and the switching device is thereby connected to the cooling device in a force-locking manner.

Likewise, on account of the particularly effective introduction of pressure it is possible that a heat-conducting layer, in particular a thermally conductive paste, having a thickness of less than 20 µm, in particular of less than 10 µm, in particular of less than 5 µm, can be arranged between the substrate, in particular that part of the substrate on which the power semiconductor components are arranged, and the cooling device.

It may likewise be preferred if the cooling device is a preferably metallic baseplate of a power semiconductor module or a heat sink.

The method according to the invention for producing a first particularly preferred configuration of an abovementioned power electronic switching device comprises the following steps, preferably to be applied in this order:

A. providing the substrate comprising an insulation layer and comprising conductor tracks electrically insulated from one another;
B. providing the connection device embodied as a film stack embodied alternately with two electrically conductive, inherently structured films and an electrically insulating film between the two conductive films, wherein a power semiconductor component is connected to a contact location of the first main surface of the connection device in a materially bonded and electrically conductive manner;
C. arranging an adhesive substance on the substrate or the connection device at adhesive sections which do not serve for electrically conductive connection between these two connection partners, that is to say the connection device and the substrate;
D. arranging and adhesively connecting the connect-ion device to the substrate by means of the adhesive substance; in this case, the first main surface of the power semiconductor component become located on the conductor track of the substrate that is assigned thereto;
E. introducing pressure on the connection device by means of a pressure device and a pressure introducing device in such a way that a force-locking electrically conductive connection is formed between the substrate and the assigned power semiconductor component.

Advantageously, a force-locking electrically conductive connection is additionally also formed between the connection device and the assigned conductor track.

The method according to the invention for producing a second particularly preferred configuration of an abovementioned power electronic switching device comprises the following steps, preferably to be applied in this order:

a. providing the substrate comprising an insulation layer and comprising conductor tracks electrically insulated from one another;
b. providing the connection device embodied as a film stack embodied alternately with two electrically conductive, inherently structured films and an electrically insulating film between the two conductive films;
c. arranging the power semiconductor component on an assigned conductor track;
d. arranging an adhesive substance with respect to the power semiconductor component and with respect to an assigned conductor track for adhesively fixing the power semiconductor component on said conductor track;
e. arranging and adhesively connecting the connect-ion device to the substrate by means of the adhesive substance;
f. introducing pressure on the connection device by means of a pressure device and a pressure introducing device in such a way that a force-locking electrically conductive connection is formed between the power semiconductor component and the assigned conductor track of the substrate.

Advantageously, a force-locking electrically conductive connection is formed additionally both between the connection device and the power semiconductor component, and between the connection device and an assigned conductor track.

It goes without saying that, unless excluded per se, the features mentioned in the singular, in particular the power semiconductor component, can be present multiply in the respective power electronic switching device or the arrangement therewith.

It goes without saying that the different configurations of the invention can be realized individually or in arbitrary combinations in order to achieve improvements. In particular, the features mentioned and explained above and hereinafter, irrespective of whether they are mentioned in the context of the power electronic switching device, the arrangement or one of the methods, can be used not only in the combinations indicated, but also in other combinations, or by themselves, without departing from the scope of the present invention.

The above and other aspects, features and advantages of the present invention will become apparent from the following description read in conjunction with the accompanying drawings, in which like reference numerals designate the same elements.

DETAILED DESCRIPTION OF THE PREFERRED EMBODIMENTS

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Various operations may be described as multiple discrete operations in turn, in a manner that may be helpful in understanding embodiments of the present invention; however, the order of description should not be construed to imply that these operations are order dependent.

Figure 1:
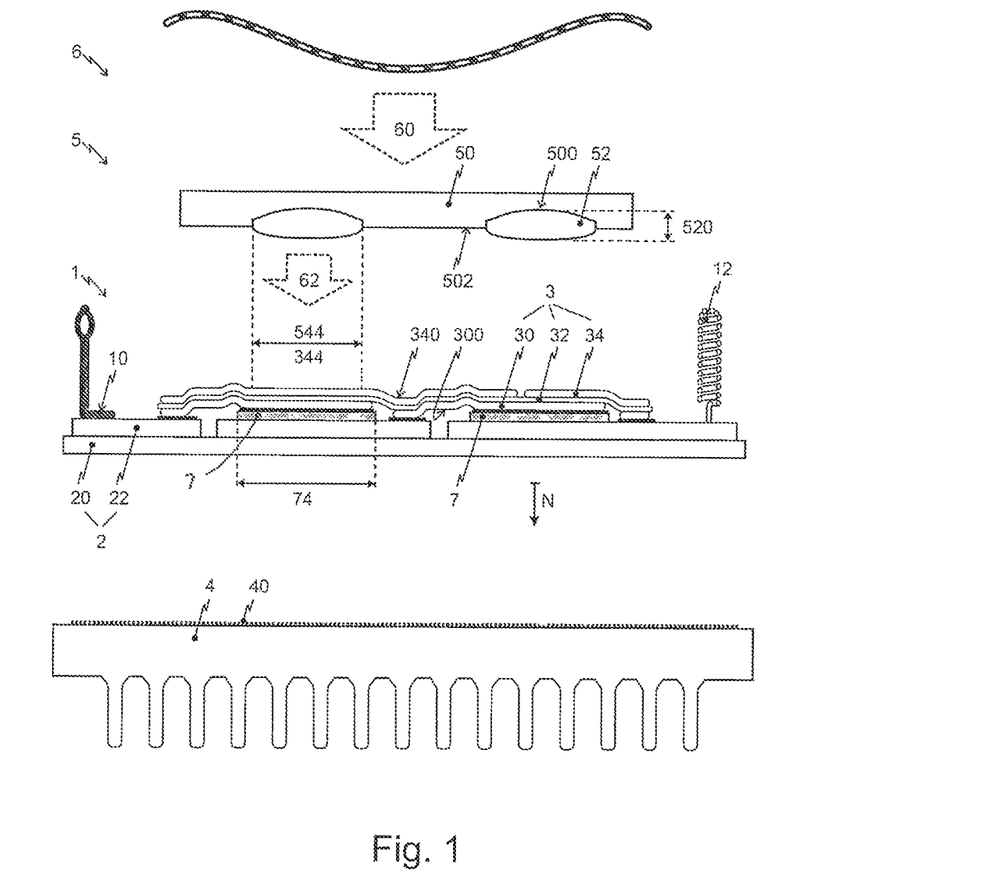
FIG. 1 shows, in an exploded illustration, an arrangement according to the invention comprising a power electronic switching device according to the invention.

FIG. 1 shows, in a schematic exploded illustration, a first configuration of a power electronic switching device 1 according to the invention. The illustration shows a substrate 2 embodied in an understood manner in the art, in principle only, and comprises an insulating substance body 20 and conductor tracks 22 arranged thereon and respectively electrically insulated from one another, said conductor tracks having different potentials, in particular load potentials, but also auxiliary, in particular switching and measurement, potentials, of the switching device. Three conductor tracks 22 having load potentials such as are typical of a half-bridge topology are specifically illustrated here.

A respective power semiconductor component 7 is arranged on two conductor tracks 22, which power semiconductor component is embodied in a routine manner in the art as an individual switch, for example as a MOS-FET, or as an IGBT with a power diode connected in antiparallel, which is illustrated here.

The internal connections of switching device 1 are formed by means of a connection device 3 made from a film composite having alternately electrically conductive films 30, 34 and electrically insulating films 32. Here the film composite has exactly two conductive films and one insulating film arranged therebetween. In this case, the surface of said film composite 3 facing the substrate 2 forms the first main surface 300 of said film composite, while the opposite surface forms the second main surface 340 of said film composite. Particularly the conductive films 30, 34 of the connection device 3 are inherently structured and thus form conductor track sections electrically insulated from one another. Said conductor track sections connect in particular the respective power semiconductor component 7, more precisely the contact areas thereof on the side facing away from the substrate 2, to conductor tracks 22 of the substrate. In this configuration, the conductor track sections are connected to the contact areas of the substrate materially bonded by means of a pressure sintering connection.

Figure 2:
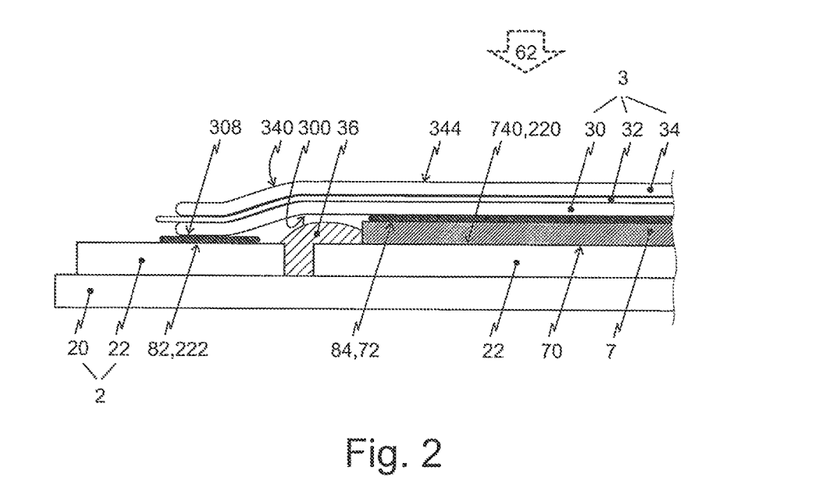
FIGS. 2 to 4 show different configurations of power electronic switching devices according to the invention.

Likewise, here the power semiconductor components 7, more precisely their contact areas of the second main surface (72, cf. FIG. 2), are connected to the connection device 3 materially bonded by means of a pressure sintering connection (84, cf. FIG. 2).

For external electrical linking, the power electronic switching device 1 has load and auxiliary terminal elements, only the load terminal elements being illustrated here. Said load terminal elements are embodied purely by way of example as metal shaped bodies 10 connected materially bonded by a contact foot to a conductor track 22 of the substrate 2, advantageously likewise by means of a pressure sintering connection. Said load terminal elements can likewise be embodied in a routine manner in the art as contact spring 12. In principle, parts of the connection device 3 itself can also be embodied as load or auxiliary terminal elements. The auxiliary terminal elements (not illustrated), such as gate or sensor terminals, are preferably likewise embodied in a routine manner in the art.

The pressure device 5, routine in the art, has a first main surface 502 facing the substrate 2 and a second main surface facing away from the substrate 2 and is illustrated here at a distance from the connection device 3, for the sake of clarity. The pressure device 5 consists of a pressure body 50 and a plurality, two being illustrated, of pressure elements 52. The pressure body 50 is embodied particularly rigidly in order to be able to pass on pressure introduced by it homogeneously to the pressure elements 52. The pressure elements 52 are arranged in cutouts 500 of the pressure body 50, which are embodied as depressions proceeding from a first main surface 502. They completely fill said cutouts 500 and project from them at the first main surface 502 in the direction of the substrate 2.

For this purpose and against the background of the thermal loads during operation of the switching device, the pressure body 50 consists of a high-temperature-resistant thermoplastic, in particular of polyphenylene sulphide. The pressure elements 52 must be able to exert a substantially constant pressure during operation and in this case in particular at different temperatures. For this purpose, the pressure elements 52 consist of an elastomer, preferably of a silicone elastomer, particularly preferably of so-called crosslinked liquid silicone (LSR—Liquid Silicone Rubber). The ratio of lateral extent 544 to vertical extent 520 of the pressure body 52 here has a ratio of 4 to 1.

The arrangement furthermore has a heat sink 4, the surface of which is covered with a heat-conducting layer 40, on which the power electronic switching device 1, more precisely the substrate 2 thereof, is arranged. On account of the configuration of the arrangement according to the invention, the heat-conducting layer 40 can have a very small thickness, which here is between 5 μm and 10 μm. In principle, the heat-conducting layer could be completely dispensed with. This is dependent on the surface constitution, in particular the roughness of the heat sink 4.

Alternatively, the insulation layer 20 of the substrate 2 can be embodied as an electrically insulating film that is laminated directly onto the heat sink 4. In this case, too, the conductor tracks 22 can be embodied as planar conduction elements composed of copper. The latter then advantageously have a thickness of 0.5 mm to 1.0 mm.

The arrangement furthermore has a pressure introducing device 6, which is arranged above the connection device 3. By means of said pressure introducing device 6, which is supported against the heat sink in a manner not illustrated, pressure 60 is introduced on the pressure body 50. Said pressure 60 is transmitted in each case as partial pressure 62 by means of the pressure elements 52 directly to a first section 344 of the second main surface 340 of the film composite 3. Said first section 344 then indirectly presses, with formation of the force-locking connection, a contact area (740, cf. FIG. 2) of the first main surface (70, cf. FIG. 2), of the power semiconductor component 7 onto an assigned contact area (220, cf. FIG. 2) of the assigned conductor track 22 of the substrate 2.

The introduced pressure 60 furthermore presses the entire substrate 2 onto the heat sink 4. The two pressure contacts, the electrically conductive between the substrate 2 and the power semiconductor component 7, and also between the substrate 2 and the heat sink 4, is effected in each case in the direction of the normal N to the power semiconductor component 7. Consequently, firstly, a highly efficient force-locking and electrically conductive connection between the substrate 2 and the power semiconductor component 7 is formed, said connection exhibiting extremely low contact resistance. Secondly, at the same time a likewise efficient, thermally conductive connection between the substrate 2 and the heat sink 4 is formed, which connection forms its most effective heat transfer precisely at that location with the highest evolution of heat, that is to say the power semiconductor component 7.

FIG. 2 shows a sectional view of a first configuration of a power electronic switching device 1 according to the invention, such as is basically already illustrated in FIG. 1.

The illustration here shows the substrate 2, comprising one insulating layer 20 and two conductor tracks 22. On the right-hand conductor track, a power semiconductor component 7, embodied as a power diode, is arranged and electrically conductively connected to the first main surface of the connection device 3 by means of a force-locking connection, here a pressure sintering connection 84.

The power semiconductor component 7, more precisely its contact area of the second main surface 72 that faces away from the substrate 2, is electrically conductively connected to the left-hand conductor track 22 by means of the connection device 3. For this purpose, the connection device 3 has a first electrically conductive film 30, wherein the contact area thereof is implemented with the corresponding contact area of the power semiconductor component 7 by means of a materially bonded pressure sintering connection 84, or some other materially bonded connection that is routine in the art.

The connection device 3 further has an electrically insulating film 32 and a further electrically conductive film 34, which in interaction form the further circuit-conforming internal connection of the power electronic switching device 1.

The power semiconductor component 7, more precisely its contact area 740 of the first main surface 70 is electrically conductively connected to the assigned conductor track 22, more precisely the contact area 220 thereof, by means of a force-locking connection. This materially bonded connection is formed by a partial pressure 62, cf. FIG. 1, being introduced directly on a first section 344 of the second main surface 340 of the connection device, here of the film composite 3. This pressure is transmitted via the power semiconductor component 7 on the contact location 740 thereof to the contact location 220 of the assigned conductor track 22, wherein the force-locking, electrically conductive connection forms between these contact locations. The respective contact locations 220, 740 of this force-locking connection are preferably provided here with a gold surface, in particular a few micrometres thin gold layer, since these have the best contact properties and contact resistances. Moreover, the respective contact locations 220, 740 of the force-locking connection have a roughness depth (Rz) of less than 5 μm, in particular of less than 2 μm, and a mean roughness (Ra) of less than 1 μm, in particular of less than 0.5 μm, in each case determined in accordance with EN ISO 4287, the contents of which are incorporated herein by reference.

The power semiconductor component 7 is electrically conductively connected to the left-hand conductor track 22. For this purpose, the first metal film 30 of the film composite 3 extends from the contact location with the power semiconductor component 7 as far as a contact location 222 of the left-hand conductor track 22. The materially bonded connection there between the contact location 308 of the connection device 3 and the contact location 222 of the conductor track 22 of the substrate 2 is formed by means of a pressure sintering connection 82 or some other connection that is routine in the art.

Moreover, the power electronic switching device 1 also comprises an adhesive, here gel-like, substance 36, which is arranged with respect to the power semiconductor component 7 and with respect to an assigned conductor track 22 for adhesively fixing the power semiconductor component 7 on said conductor track 22. In this configuration, said adhesive substance 36 is at the edge of the power semiconductor component 7 and also on the substrate. This gives rise to an adhesive connection between the power semiconductor component 7 and the substrate such as is necessary in order to be able to implement in particular the second method according to the invention.

Figure 3:
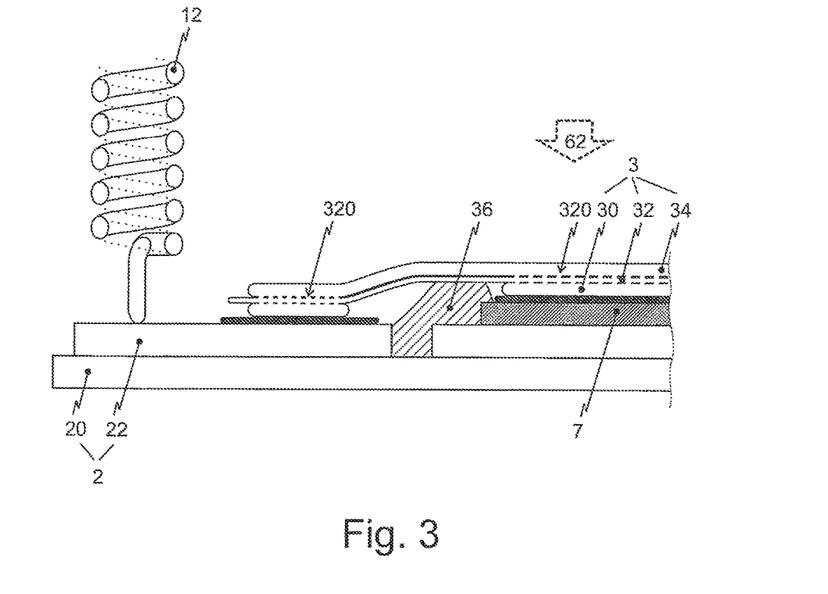

FIG. 3 shows a sectional view of a second configuration of a power electronic switching device 1 according to the invention. The electrically conductive connection between the power semiconductor component 7 and the connection device 3 is formed here once again by means of the materially bonded connection described above. The force-locking connection of the power semiconductor component 7 to the assigned conductor track 22 of the substrate is likewise formed in the manner as described above.

In contrast to the first configuration in accordance with FIG. 2, here the connection device 3 has, in the contact regions with respect to the power semiconductor component 7 and also with respect to the left-hand conductor track 22, only sections of the first electrically conductive film 30 which are not directly connected to one another. Rather, plated-through holes 320 from the first conductive film 30 to the second conductive film 34 through the insulating film 32 are arranged in said sections. Consequently, the electrical connection between the left-hand conductor track 22 and the power semiconductor component 7 is effected via the second electrically conductive film 34. Moreover, a terminal element 12, embodied here by way of example as a spring contact element, is illustrated on the left-hand conductor track 22.

The adhesive, here gel-like, substance 36 is likewise arranged here with respect to the power semiconductor component 7 and with respect to an assigned conductor track 22 for adhesively fixing the power semiconductor component 7 on said conductor track 22. However, said adhesive substance 36 additionally bears on the first main surface of the connection device 3, as a result of which the latter is also adhesively connected to the substrate. The adhesive connections are formed here in a manner that is routine in the art, in principle. By way of example, the power semiconductor component can be temporarily pressed onto the substrate by means of a holding device, the adhesive substance 36 can subsequently be arranged and then the cross linking of said adhesive substance can be initiated, thus giving rise to the adhesive connection. As soon as the latter has attained a sufficient adhesive force, even if the cross-linking has not yet taken place completely, the holding device can be removed again.

Figure 4:
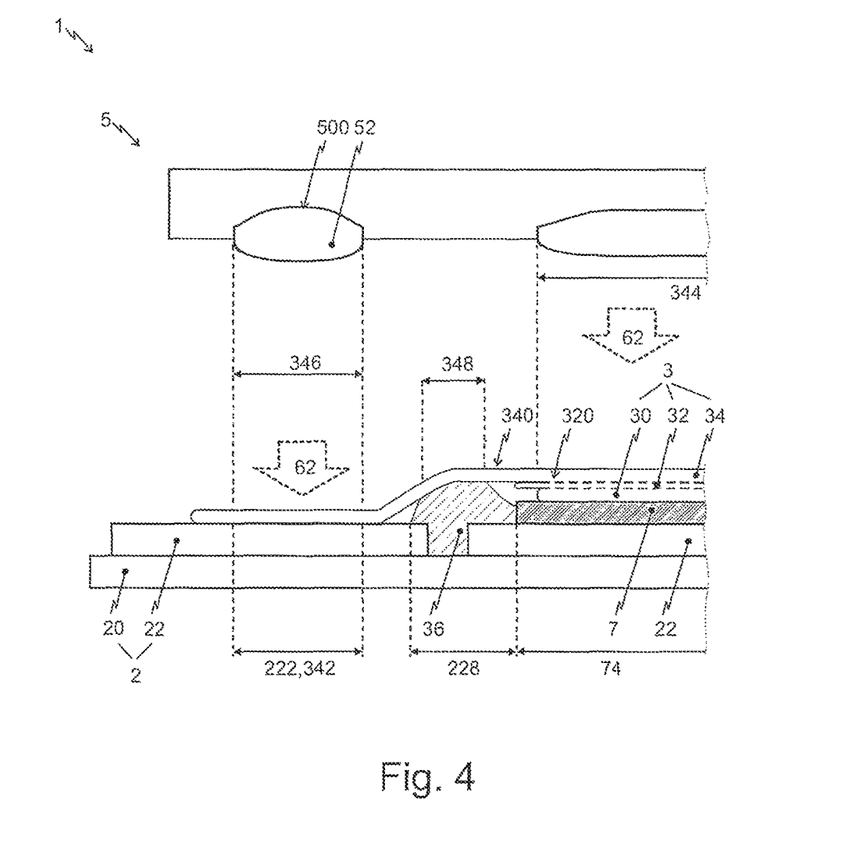

FIG. 4 shows a sectional view of a third configuration of a power electronic switching device 1 according to the invention, said third configuration being produced in accordance with the second method according to the invention. The substrate 2 with the power semiconductor component 7 is embodied here in the manner as already described with regard to FIG. 3.

An electrically insulating adhesive substance 36, preferably an adhesive based on silicone rubber, is arranged on the substrate 2 between the two conductor tracks 22 and in a manner overlapping the latter in edge regions, and also in a manner bearing against the power semiconductor component 7. It goes without saying that the adhesive substance can also be embodied as a polyimide or an epoxy resin. Without application of pressure by means of the pressure device 5, said adhesive substance 36 provides for an adhesive, that is to say at least adherent, connection between the substrate 2 in the section 228 thereof and the connection device 3 in the section 348 thereof. What is essential here is that said adhesive connection does not contribute to the electrical conduction and is thus also only arranged in sections 228, 348 in which no electrically conductive contact is formed between the connection, device 3 and the substrate 2, more precisely a conductor track 22 or the power semiconductor component 7.

The electrically conductive connection between the power semiconductor component 7 and the left-band conductor track 22 by means of the connection device 3 is formed here by the second electrically conductive film 34 rather than by the first electrically conductive film. In this case, in contrast to the configuration in accordance with FIG. 3, no section of the first conductive film 30 and thus also no plated-through hole is necessary in the region of the left-hand conductor track 22. In the region of the power semiconductor component 7, the configuration of the connection device 3 is as described with regard to FIG. 3.

The electrically conductive connection between the connection device 3 and the power semiconductor component 7, between the power semiconductor component 7 and the substrate, and between the connection device 3 and the conductor track 22 of the substrate 2, is embodied in each case as a force-locking connection. For this purpose, a respective partial pressure 62 (cf. also FIG. 1) is introduced on the respective connection by means of a respective assigned pressure element 52 of the pressure device 5. In this case, therefore, a partial pressure 62 is exerted on a second section 346 of the second main surface 340 of the connection device, as a result of which a contact area 342 of the second electrically conductive film 34 is pressed onto a contact area 222 of the left-hand conductor track 22 and is electrically conductively connected thereto in a force-locking manner. Likewise, a partial pressure 62 is exerted on a first section 344 of the second main surface 340 of the connection device, as a result of which the connection device 3 is pressed onto the power semi-conductor component 7 and the latter onto the substrate 2 and is electrically conductively connected thereto in each case in a force-locking manner.

A major advantage of this third configuration of the power electronic switching device 1 is that no materially bonded and electrically conductive connection at all need be implemented here. The connection device 3, the power semiconductor component 7 and the substrate 2 are exclusively adhesively connected to one another by means of the adhesive substance 36. It is only during the operation of the power electronic switching device 1 that the described application of pressure takes place, which here forms the force-locking electrically conductive contact between, the connection device 3 and the power semi-conductor component 7, between the power semiconductor component 7 and the substrate 2, and also between the connection device 3 and the substrate 2.

Figure 5A:
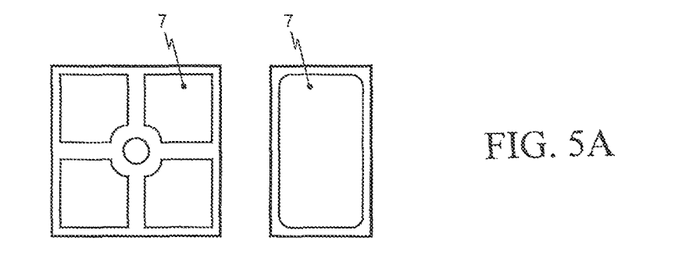
FIGS. 5A-5D show a plan view of a power electronic switching device in different sectional planes.

FIGS. 5A-5D shows a plan view of a power electronic switching device 1 in different sectional planes. The sectional plane in accordance with FIG. 5A shows two power semiconductor components 7, which are arranged typically, but in a manner not illustrated, on a common conductor track of a substrate. Without restricting the generality, this involves a transistor having a central gate terminal area and emitter terminal areas bordering the latter, and a diode having a cathode terminal area.

Figure 5B:
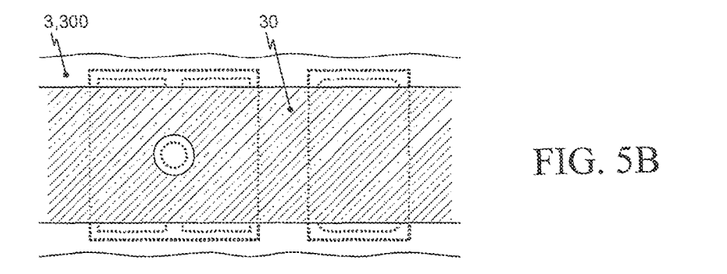

FIG. 5B shows the first, inherently structured, electrically conductive film 30 of the connection device 3. This forms an electrically conductive connection between the emitter terminal areas of the transistor and the cathode terminal area of the diode. In this case, a cutout is implemented for the gate terminal area of the transistor.

Figure 5C:
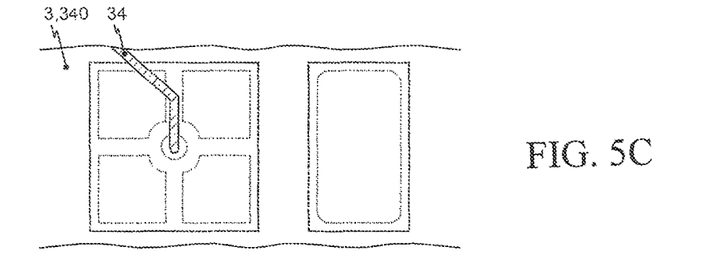

FIG. 5C shows the second inherently structured electrically conductive film 34 of the connection device 3. This forms an electrically conductive connection to the gate terminal area of the transistor.

Figure 5D:
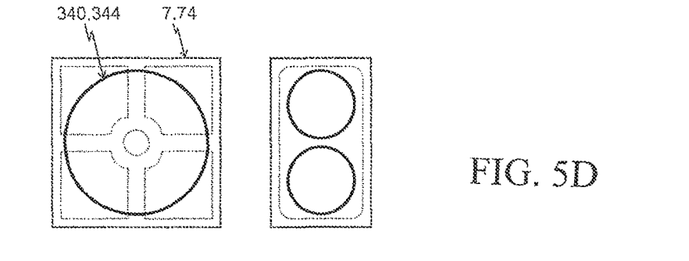

FIG. 5D shows as it were the footprint of the contact elements of the contact device that are assigned to the power semiconductor components 7, wherein only one contact element is assigned to the transistor, on account of the square basic shape thereof, and two contact elements are assigned to the diode, on account of the rectangular basic shape thereof. The, respective footprint corresponds to those first sections 344 on the second main surface 340 of the connection device 3 which are arranged in alignment with the power semiconductor components in the direction of the normal and are projected here onto the respective power semiconductor component. It becomes clear here that the area of the footprint, that is to say that area which is intended for introducing pressure, covers the largest possible portion of the area of the power semiconductor component, without going beyond said area.

Although only a few embodiments have been disclosed in detail above, other embodiments are possible and the inventors intend these to be encompassed within this specification. The specification describes certain technological solutions to solve the technical problems that are described expressly and inherently in this application. This disclosure describes embodiments, and the claims are intended to cover any modification or alternative or generalization of these embodiments which might be predictable to a person having ordinary skill in the art.

Also, the inventors intend that only those claims which use the words "means for" are intended to he interpreted under 35 USC 112, sixth paragraph. Moreover, no limitations from the specification are intended to be read into any claims, unless those limitations are expressly included in the claims.

Where a specific numerical value is mentioned herein, it should be considered that the value may be increased or decreased by 20%, while still staying within the teachings of the present application, unless some different range is specifically mentioned. Where a specified logical sense is used, the opposite logical sense is also intended to be encompassed.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A power electronic switching device, comprising
    a substrate and a power semiconductor component arranged thereon;
    a connection device on the power semiconductor component;
    comprising a pressure device providing an urging force to the connection device;
    the substrate has a plurality of conductor tracks each electrically insulated from one another;

the power semiconductor component arranged on one of the conductor tracks;

the connection device is embodied as a film composite, and said film composite further comprising:

an electrically conductive film and an electrically insulating film therebetween;

film composite forming a first film composite main surface (300) and a second film composite main surface;

the switching device is connected internally in a circuit-conforming manner by the connection device;

a first main surface semiconductor contact area of a first power semiconductor main surface of the power semiconductor component is connected to a first conductor track contact area of an assigned one of said plurality of conductor track of the substrate in a force-locking and electrically conductive manner;

the pressure device has a pressure body and at least one pressure element projecting therefrom in a direction of the power semiconductor component;

the pressure element pressing onto a first section of the second film composite main surface of the film composite; and said first section is arranged within an area proximate the power semiconductor component in a projection along a direction normal (N) to the power semiconductor component.

2. The switching device, according to claim 1, further comprising:

a second connection device contact area of the connection device is connected to a second conductor contact area of another assigned one of said plurality of assigned conductor tracks of the substrate in a force-locking or materially bonded and electrically conductive manner.

3. The switching device, according to claim 1, wherein:

the power semiconductor component is electrically conductively connected by a second power semiconductor main surface to an assigned first film contact area of the first film composite main surface of the connection device in one of a force-locking manner and a materially bonded manner.

4. The switching device, according to claim 1, wherein:

the pressure body has at least a first cutout; and a pressure element projects from said first cutout.

5. The switching device, according to claim 4, wherein:

the first cutout of the pressure body is embodied as a depression proceeding from a first main surface of said pressure body;

the pressure element filling the cutout of the pressure body; and the pressure element projecting away from the cutout of the pressure body at the first main surface thereof.

6. The switching device, according to claim 4, wherein:

the pressure body consists of a high-temperature-resistant thermoplastic, said high-temperature thermoplastic including at least a portion as polyphenylene sulphide; and the pressure element consists of an elastomer; wherein said elastomer is at least one of a silicone elastomer and a crosslinked liquid silicone elastomer.

7. The switching device, according to claim 4, wherein:

the ratio of a lateral extent of the pressure element to a vertical extent of the pressure element is more than 2 to 1, in particular of more than 4 to 1.

8. The switching device, according to claim 1, wherein;

a surface area of the first section of the second film composite main surface of the film composite is at least 20% of the area of the assigned power semiconductor component.

9. The switching device, according to claim 3, wherein:

the respective electrically conductive connection of said power semiconductor component is said materially bonded manner; and said materially bonded manner is at least one of a soldering connection an adhesive connection and a pressure sintering connection.

10. A switching arrangement, comprising:

an electronic switching device according, to claim 1;

said switching arrangement, further comprising:

a cooling device;

a pressure introducing device supported at least one of indirectly and directly against the cooling device; and said pressure device introducing a pressure proximately centrally on the pressure device, whereby the switching device is connected to the cooling device in a force-locking manner.

11. The switching arrangement, according to claim 10, further comprising:

a heat-conducting layer having a thickness of less than 20 μm between the substrate and the cooling device.

12. The switching arrangement, according to claim 10, wherein;

the cooling device is one of a metallic baseplate of a power semiconductor module and a heat sink.

13. A method, for producing a first configuration of a power electronic switching device, comprising the steps of:

A. providing a substrate comprising an insulation layer and a plurality of conductor tracks;

each said conductor track electrically insulated from one another;

B. providing a connection device embodied as a film stack;

said film stack formed with an electrically insulating film spaced between two electrically conductive inherently structured films;

wherein a power semiconductor component is connected to a contact location of the connection device in one of a materially bonded manner and an electrically conductive manner;

C. arranging an adhesive substance on one of the substrate and the connection device at adhesive sections which do not serve for electrically conductive connections between said connection device and the substrate;

D. arranging and adhesively connecting the connection device to the substrate by the adhesive substance; and E. introducing a pressure on the connection device by a pressure device and a pressure introducing device thereby forming a force-locking electrically conductive connection between the substrate and the power semi conductor component.

14. The method, according to claim 13, further comprising the step of:

forming a force-locking electrically conductive connection between the connection device and the assigned conductor track.

15. A method for producing a second configuration of a power electronic switching device, comprising the steps of:

a. providing a substrate comprising an insulation layer and a plurality of conductor tracks electrically insulated from one another;

b. providing a connection device embodied as a film stack;

said film stack embodied as an electrically insulating film between two electrically conductive inherently structured films;

c. arranging a power semiconductor component on an assigned one of said plurality of conductor track of said substrate;

d. arranging an adhesive substance and adhesively fixing the power semiconductor component on at least one of assigned conductor tracks;

e. arranging and adhesively connecting the connection device to the substrate by means of the adhesive substance; and f. introducing a pressure on the connection device by urging a pressure introducing device and a pressure device to form a force-locking electrically conductive connection between the power semiconductor component and the assigned conductor track of the substrate.

16. The method, according to claim 15, further comprising the steps of:

forming a force-locking electrically conductive connection between the connection device and the power semiconductor component; and forming a force-locking electrically conductive connection between the connection device and an assigned conductor track.

* * * * *